(12) United States Patent
Mosalikanti et al.

(10) Patent No.: US 10,423,182 B2
(45) Date of Patent: Sep. 24, 2019

(54) SELF-REFERENCED DROOP DETECTOR CIRCUITRY

(71) Applicant: Intel Corporation, Santa Clara, CA (US)

(72) Inventors: Praveen Mosalikanti, Portland, OR (US); Gerhard Schrom, Hillsboro, OR (US); Vaughn J. Grossnickle, Hillsboro, OR (US); Nasser A. Kurd, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 213 days.

(21) Appl. No.: 15/478,457

(22) Filed: Apr. 4, 2017

(65) Prior Publication Data

US 2018/0284828 A1    Oct. 4, 2018

(51) Int. Cl.
*G05F 1/625* (2006.01)
*H03L 7/093* (2006.01)
*H03K 5/24* (2006.01)
*G01R 19/165* (2006.01)

(52) U.S. Cl.
CPC ....... *G05F 1/625* (2013.01); *G01R 19/16552* (2013.01); *H03K 5/24* (2013.01); *H03L 7/093* (2013.01)

(58) Field of Classification Search
CPC ... G05F 1/625; H03L 7/093; G01R 19/16552; H03K 5/24
USPC .......................................... 455/260
See application file for complete search history.

(56) References Cited

U.S. PATENT DOCUMENTS

| | | | |
|---|---|---|---|
| 5,889,440 A * | 3/1999 | Kowshik | H03K 3/0315 331/1 A |
| 2004/0183613 A1* | 9/2004 | Kurd | G01K 7/32 331/186 |
| 2017/0261537 A1* | 9/2017 | Chong | G01R 19/16504 |

* cited by examiner

*Primary Examiner* — Lee Nguyen
(74) *Attorney, Agent, or Firm* — Schwegman Lundberg & Woessner, P.A.

(57) ABSTRACT

Some embodiments include apparatuses and methods of operating such apparatuses. One of the embodiments includes an input node to receive an input voltage, a circuit portion to generate first, second, and third voltages based on the input voltage, a comparator circuit to compare the first voltage with the second voltage to generate a first signal and to compare the first voltage with the third voltage to generate a second signal, and an output circuit to generate an output signal based on the first and second signals.

18 Claims, 9 Drawing Sheets

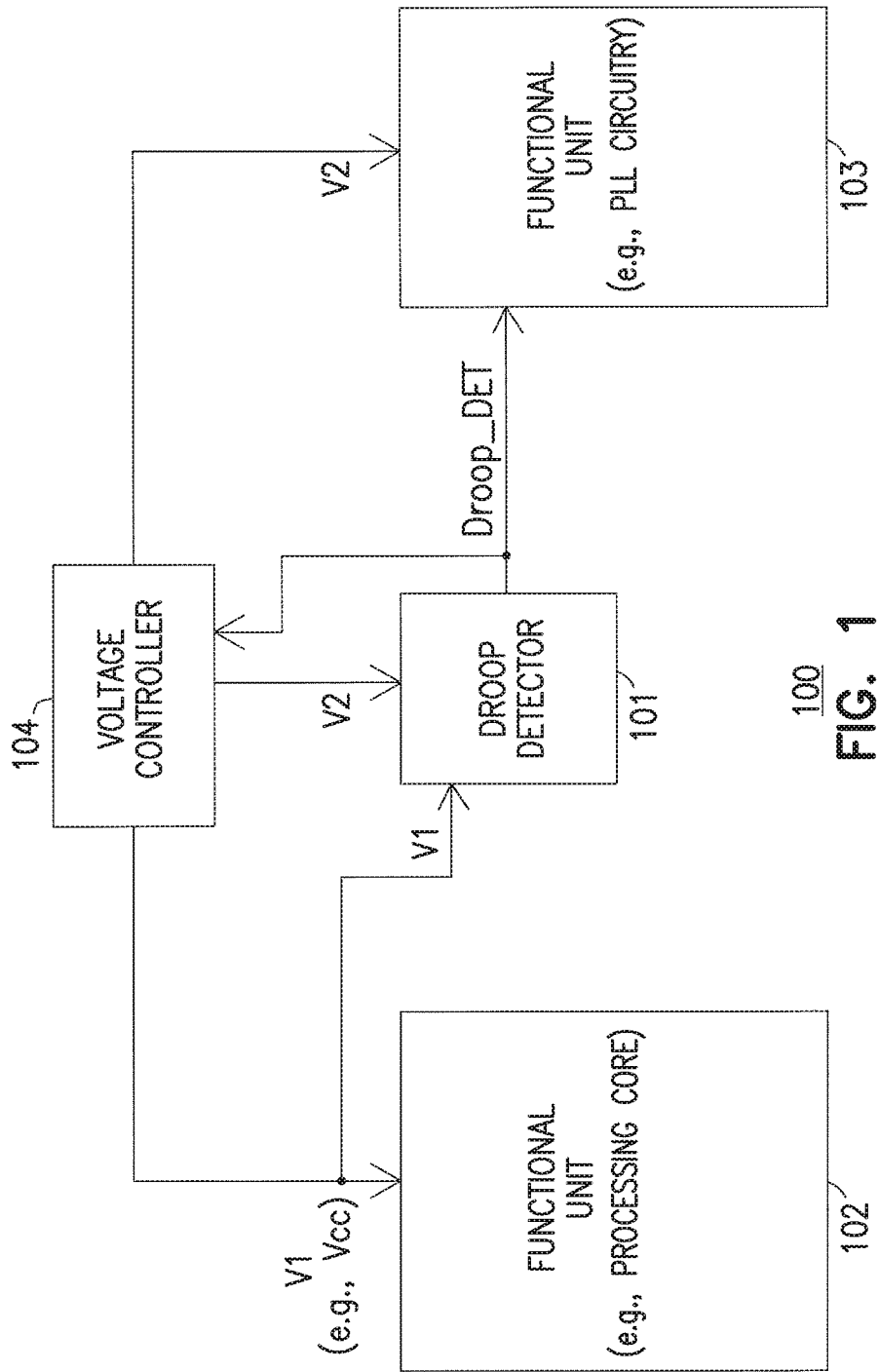

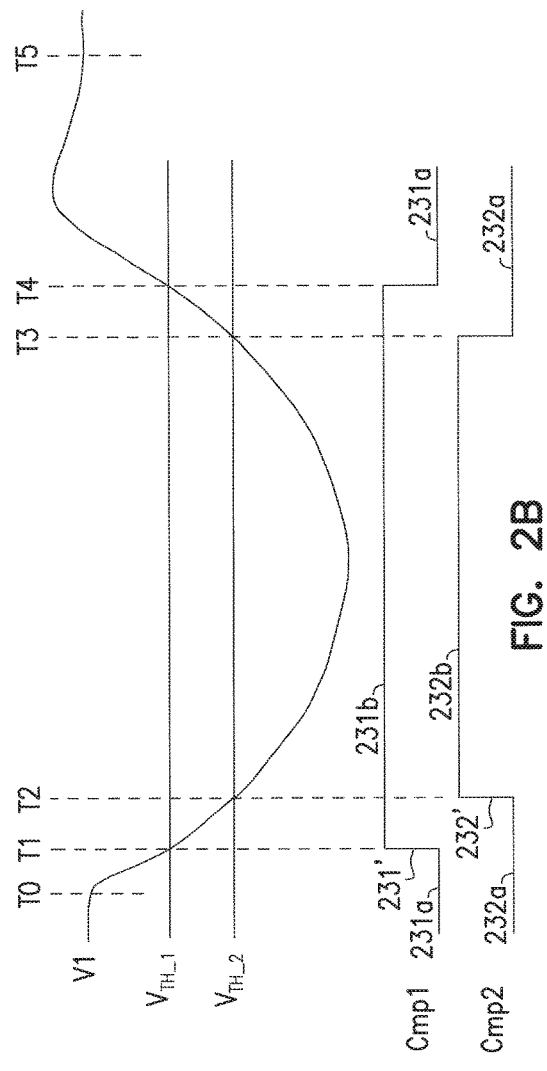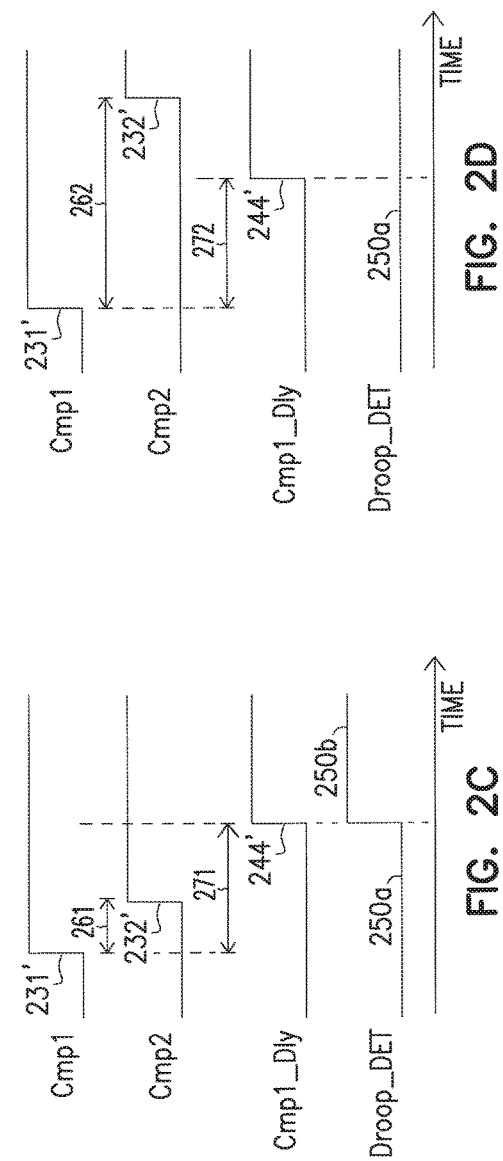

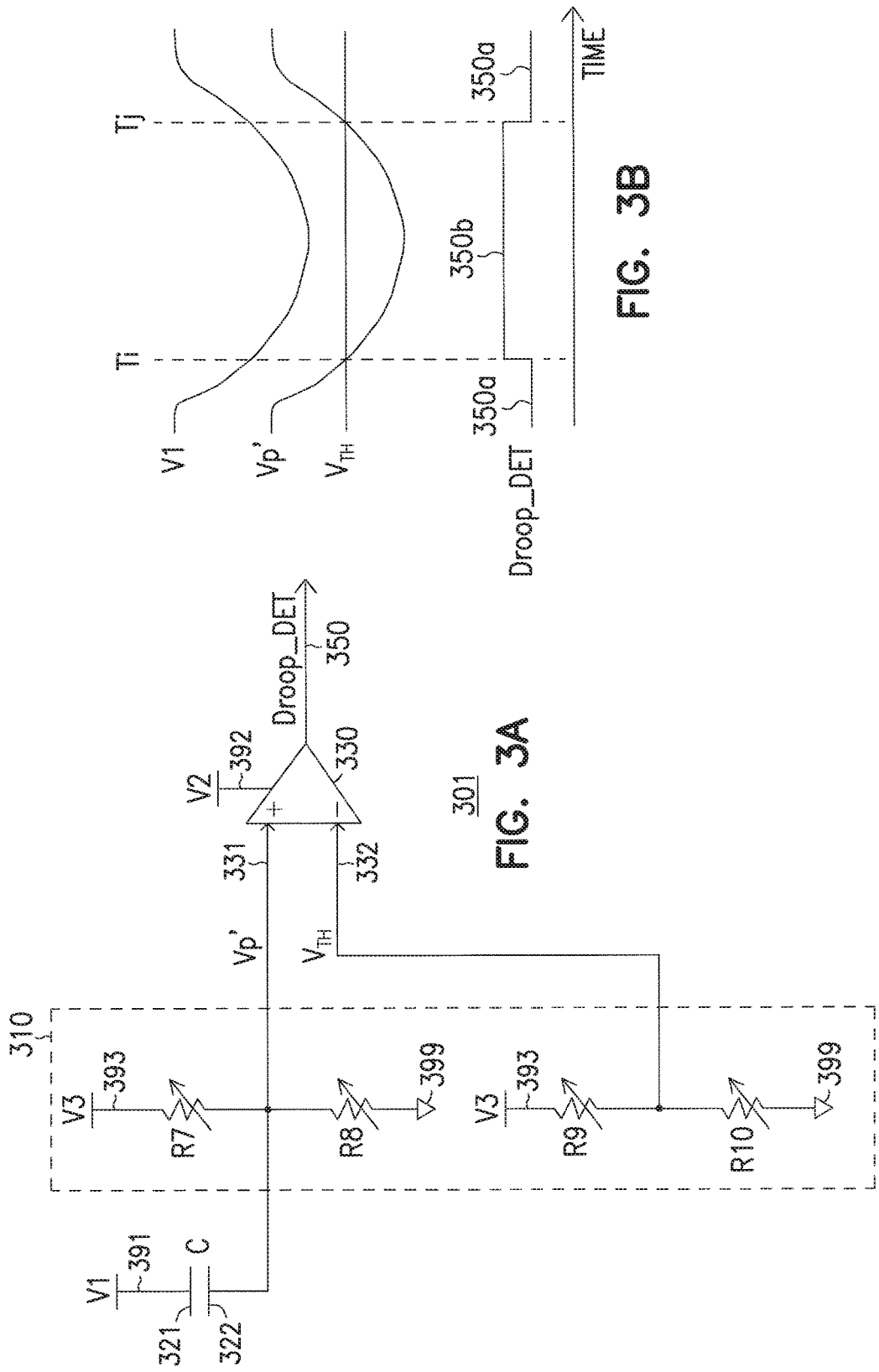

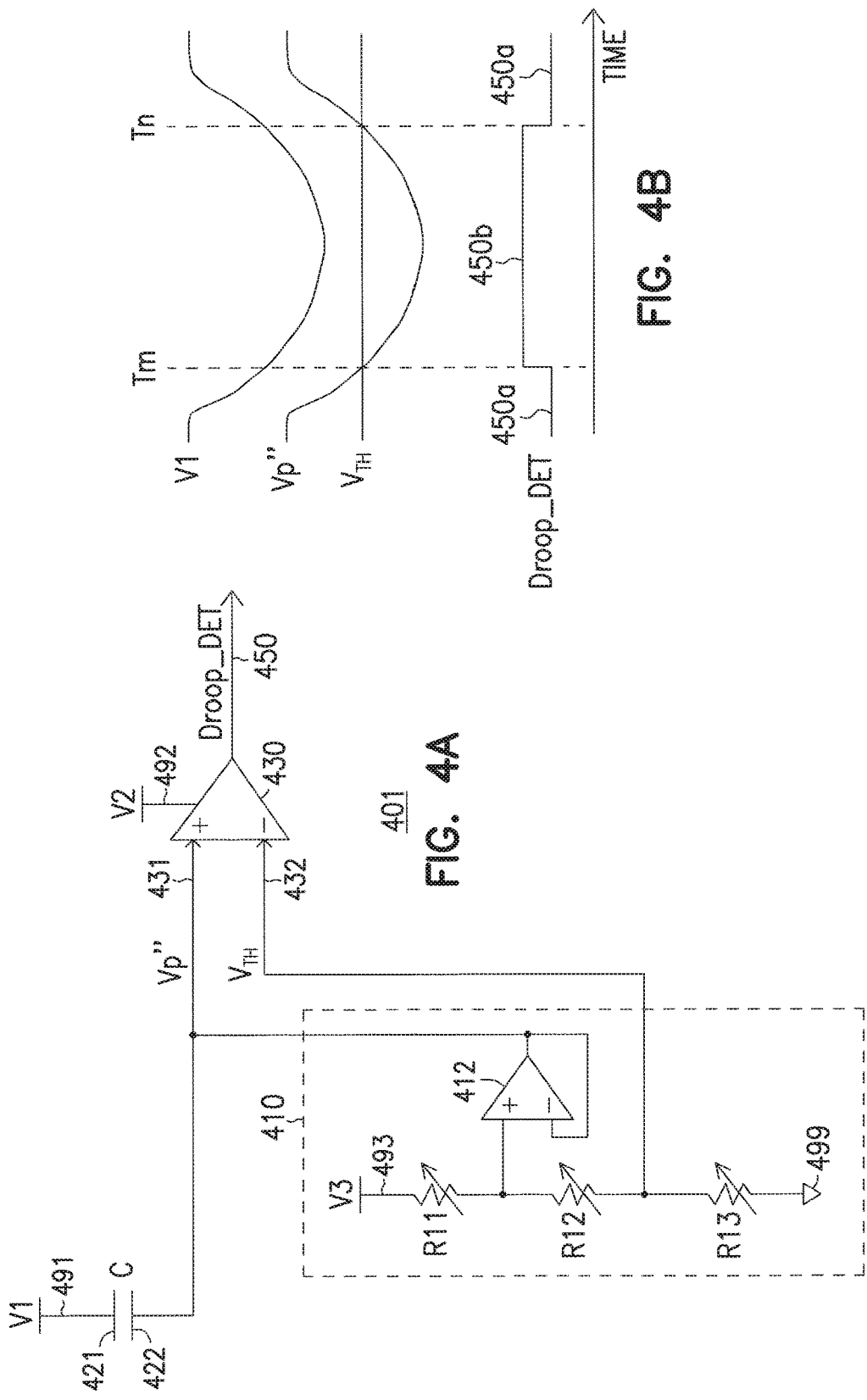

SELF-REFERENCED DROOP DETECTOR CIRCUITRY

TECHNICAL FIELD

Embodiments described herein pertain to integrated circuits (ICs). Some embodiments relate to detection of variation in voltages in ICs and control of circuity in response to the detection.

BACKGROUND

Many electronic devices or systems, such as computers, tablets, digital televisions, and cellular phones include components (e.g., integrated circuit chips) that rely heavily on a stable supply voltage in order to maintain proper operations. Unintentional variations in operating conditions can cause the value of the supply voltage to drop below a specified value. Such a drop in the supply voltage can cause the device or system to behave unpredictably. Many conventional techniques provide solutions to deal with such unintentional variations. However, as described in more detail below, limitations and complexity in some of the conventional techniques may cause such techniques to be unsuitable to be used in some devices or systems.

BRIEF DESCRIPTION OF THE DRAWINGS

FIG. 1 shows an apparatus including a droop detector, functional units, and a voltage controller, according to some embodiments described herein.

FIG. 2B shows an example waveform of a voltage and signal levels of some of the signals of the droop detector of FIG. 2A, according to some embodiments described herein.

FIG. 2C shows a timing diagram illustrating timing relationships among some of the signals including an output signal of the droop detector of FIG. 2A when a droop is detected, according to some embodiments described herein.

FIG. 2D shows a timing diagram illustrating timing relationships among some of the signals including an output signal of the droop detector of FIG. 2A when a droop is not detected, according to some embodiments described herein.

FIG. 3A shows a schematic diagram of a droop detector including another reference-less scheme, according to some embodiments described herein.

FIG. 3B shows a timing diagram illustrating relationships between an output signal and the values of some of the voltages of the droop detector of FIG. 3A, according to some embodiments described herein.

FIG. 4A shows a schematic diagram of a droop detector including another reference-less scheme, according to some embodiments described herein.

FIG. 4B shows a timing diagram illustrating relationships between an output signal and the values of some of the voltages of the droop detector of FIG. 4A, according to some embodiments described herein.

DETAILED DESCRIPTION

Figure 2A:
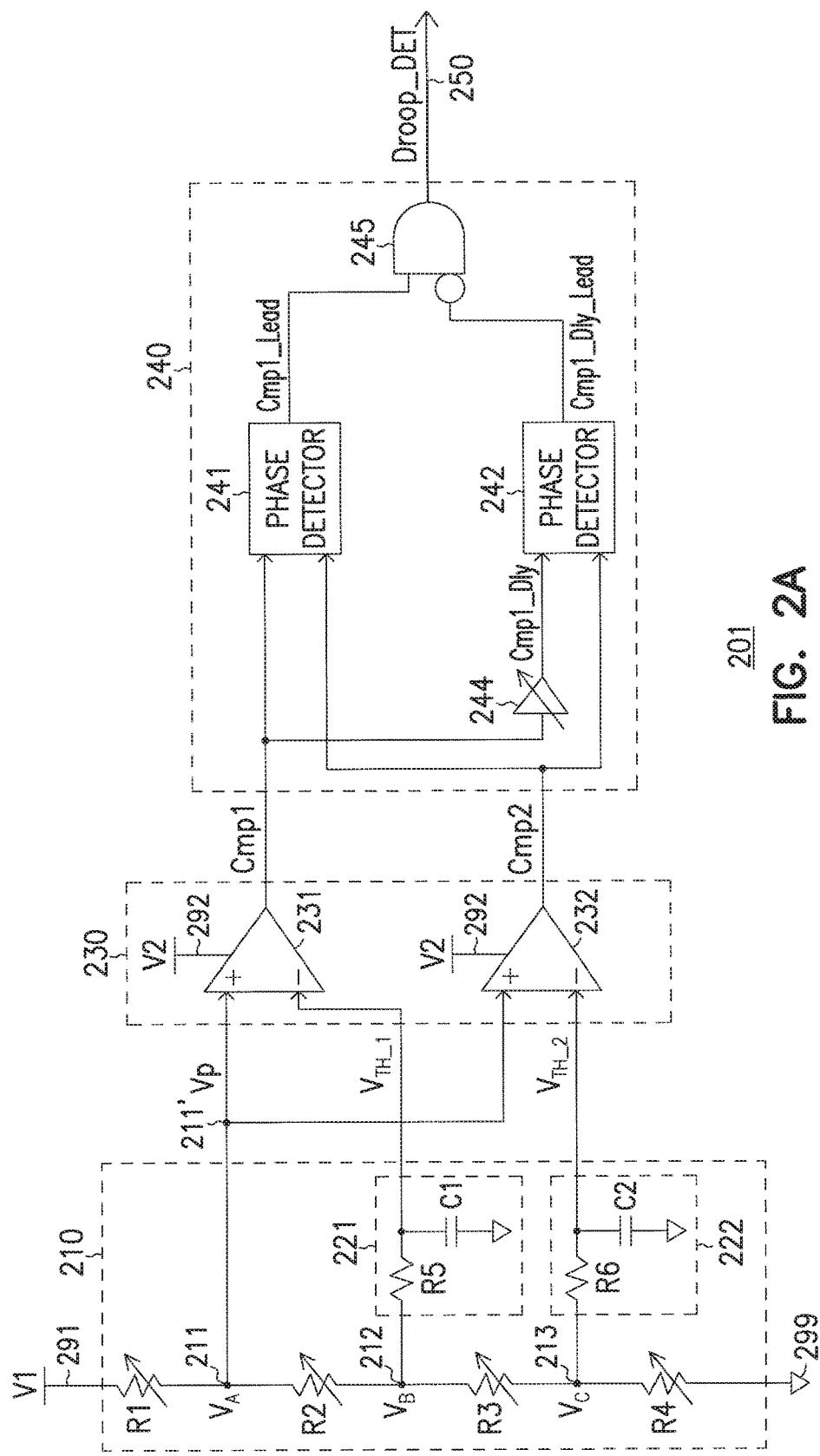
FIG. 2A shows a schematic diagram of a droop detector including a reference-less scheme, according to some embodiments described herein.

The techniques described herein include improved droop detector circuitry to detect variations in voltages, including supply voltages in integrated circuit devices. Operations of functional units (e.g., PLL circuitry) based on results from the droop detector circuitry are also described. Detailed circuit elements, operations, and improvements associated the techniques described herein are presented below with reference to FIG. 1 through FIG. 7.

FIG. 1 shows an apparatus 100 including a droop detector 101, functional units 102 and 103, and a voltage controller 104, according to some embodiments described herein. Apparatus 100 can include or be included in an electronic device or system, such as a computer (e.g., server, desktop, laptop, or notebook), a tablet, a cellular phone, or other electronic devices or systems. Droop detector 101, functional units 102 and 103, and a voltage controller 104 can be part of the same device or different device. For example, apparatus 100 can include a device that has a single IC chip where droop detector 101, functional units 102 and 103, and a voltage controller 104 can be located on (e.g., formed in or formed on) a semiconductor (e.g., silicon) substrate of the IC chip. In this example, functional units 102 and 103 can include any combination (e.g., any two of) of a processing unit (e.g., a processing core of a general purpose processor or a digital signal processing (DSP) processor), a clock generator PLL circuitry) or other clock distribution circuitry), a memory device, a direct memory controller, a bus controller, a radio frequency (RF) module (e.g., RF transceiver), an analog to digital converter (ADC), or other circuit components.

Alternatively, droop detector 101, functional units 102 and 103, and a voltage controller 104 can be located in different (e.g., separate) devices. For example, apparatus 100 can include separate IC chips, and two or more of droop detector 101, functional units 102 and 103, and a voltage controller 104 can be located on different IC chips. As an example, droop detector 101 and functional units 102 and 103 can be located in one IC chip, and voltage controller 104 can be located in another IC chip. In another example, droop detector 101 and a voltage controller 104 can be located in one IC chip separate from functional units 102 and 103. In a further example, droop detector 101 can be located in one IC chip separate from functional units 102 and 103 and voltage controller 104.

As shown FIG. 1, droop detector 101 can receive a voltage V1, which can be the same as a supply voltage (e.g., Vcc) of functional unit 102. Droop detector 101 can receive a voltage V2, which can be used as supply voltage for some circuit elements of droop detector 101. The values of voltages V1 and V2 can be the same or can be different. Droop detector 101 can operate to monitor the value of voltage V1 and determine whether a droop in voltage V1 is detected. For example, a droop is detected when the value of voltage V1 is less than a threshold value, and a droop is not detected when the value of voltage V1 is not less than (e.g., greater than) the threshold value. The threshold value can be a predetermined voltage value (e.g., close to a minimum operating voltage value) for functional unit 102, 103, or both, to operate safely or efficiently.

Droop detector 101 can control the signal levels of signal Droop_DET based on the monitoring of value of voltage V1. The signal level of signal Droop_DET can indicate whether a droop is detected. For example, droop detector 101 can cause signal Droop_DET to be at one signal level (e.g., a level corresponding to logic one) when a droop is detected, and at another signal level (e.g., a level corresponding to logic zero) when a droop is not detected.

Voltage controller 104 can generate voltages V1 and V2. Based on the signal level of signal Droop_DET (which indicates whether or not a droop is detected), voltage controller 104 can control (e.g., adjust) the value of voltage V1, V2, or both in order to maintain safe or efficient operating conditions in functional unit 102, 103, or both.

Functional unit 103 can receive voltage V2 and use it as a supply voltage for some circuit elements of functional unit 103. Functional unit 103 can control some of its operations based on the signal level of signal Droop_DET. An example of function unit 103 (e.g., PLL circuitry) is described below with reference to FIG. 5A and FIG. 5B.

Apparatus 100 of FIG. 1 includes other components (e.g., component in a processor chip, an application specific integrated circuit (ASIC) chip, or other types of IC chips) that are omitted from FIG. 1 so as to not obscure from the techniques described herein. Droop detector 101 of FIG. 1 can include any of the droop detectors described below with reference to FIG. 2A through FIG. 7.

FIG. 2A shows a schematic diagram of a droop detector 201 including a reference-less scheme, according to some embodiments described herein. Droop detector 201 can correspond to droop detector 101 of FIG. 1. As shown in FIG. 2A droop detector 201 can include an input node 291 to receive a voltage (e.g., input voltage) V1 and a ground node 299 to receive a ground potential (e.g., voltage Vss). Voltage V1 can include a supply voltage (e.g., Vcc) used by another component (e.g., functional unit 102 of FIG. 1). Thus, input node 291 can include a supply node (e.g., supply node that provides voltage Vcc to functional unit 102 of FIG. 1).

Droop detector 201 can also include a node 292 to receive a voltage V2, which can include a supply voltage of droop detector 201. Thus, node 292 can also include a supply node of droop detector 201. Voltages V1 and V2 can have different values (e.g., input node 291 and node 292 are part of different supply voltage rails). Alternatively, voltages V1 and V2 can have the same value.

As shown in FIG. 2A, droop detector 201 can include a circuit portion 210, low pass filters 221 and 222, comparator circuit 230, and an output circuit 240. Droop detector 201 can generate a signal Droop_DET at a node (e.g., output node) 250.

Circuit portion 210 can include resistors R1, R2, R3, and R4 coupled in series with each other and coupled between input node 291 and ground node 299. Resistors R1, R2, R3, and R4 can be variable resistors, such that the values of each of resistors R1, R2, R3, and R4 can be changed. For example, the values of resistors R1, R2, R3, and R4 can be programmable after resistors R1, R2, R3, and R4 are formed. Resistors R1, R2, R3, and R4 may themselves be formed from some combination of individual resistors whose effective resistance is programmable. The resistance values of resistors R1, R2, R3, and R4 can be the same or can be different, as long as such resistance values can allow selection for the values predetermined values) of voltages $V_{TH\_1}$ and $V_{TH\_2}$ (e.g., threshold voltages).

Circuit portion 210 can generate voltages $V_A$, $V_B$, and $V_C$, at nodes 211, 212, and 213, respectively. Resistors R1, R2, R3, and R4 can form a resistor ladder between input node 291 and ground node 299, such that voltages $V_A$, $V_B$, and $V_C$ can be generated at different nodes between resistors R1 R2, R3, and R4, and such that voltages $V_A$, $V_B$, and $V_C$ can be generated based on the same voltage V1. In this resistor-ladder arrangement, the value of each of voltages $V_A$, $V_B$, and $V_C$ is less than the value of voltage V1. The value voltage $V_A$ is greater than the value of voltage $V_B$. The value voltage $V_B$ is greater than the value of voltage $V_C$ (e.g., $V_C$ $V_B$<$V_A$<V1). Since each of voltages $V_A$, $V_B$, and $V_C$ is generated base on voltage V1, the values of voltages $V_A$, $V_B$, and $V_C$ decrease when a value of voltage V1 decreases, and the values of voltages $V_A$, $V_B$, and $V_C$ increase when a value of voltage V1 increases.

Low pass filter 221 can include a resistor R5 and a capacitor C1. Low pass filter 221 can generate voltage (e.g., threshold voltage) $V_{TH\_1}$ based on voltage $V_B$ at node 212. Low pass filter 222 can include a resistor R6 and a capacitor C2. Low pass filter 222 can generate voltage (e.g., threshold voltage) $V_{TH\_2}$ based on voltage $V_B$ at node 213. Since the value of voltage $V_C$ at node 213 is less than the value of voltage $V_B$ at node 212, the value of voltage $V_{TH\_2}$ (generated based on voltage $V_C$) can be less than the value of voltage $V_{TH\_1}$ (generated based on voltage $V_B$). Since each of voltages $V_{TH\_1}$ and $V_{TH\_2}$ are generated base on voltages $V_B$ and $V_C$, respectively, and voltages $V_B$ and $V_C$ are generated based on voltage V1, the values of voltages $V_{TH\_1}$ and $V_{TH\_2}$ decrease when the value of voltage V1 decreases and increase when the value of voltage V1 increases. This allows droop detector 201 to detect a droop in voltage V1 based on a relationship between relative value (e.g., not a fixed value) of voltage V1 and each of $V_{TH\_1}$, and $V_{TH\_2}$. This allows droop detector 201 to detect a droop in voltage V1 based on a rate of change (e.g., discussed below) of voltage V1 and each of $V_{TH\_1}$, and $V_{TH\_2}$.

Low pass filters 221 and 222 may be omitted from droop detector 201. However, the inclusion of low pass filters 221 and 222 in droop detector 201 can allow voltages $V_{TH\_1}$ and $V_{TH\_2}$ to be relatively noise-free or have reduced noise relative to the noise (e.g., noise from voltage V1) that may be introduced to voltage Vp. The noise-free or negligible noise in voltages $V_{TH\_1}$ and $V_{TH\_2}$ can improve detection operation of droop detector 201 when voltage Vp is compared with each of voltages $V_{TH\_1}$ and $V_{TH\_2}$ is during operation of droop detector 201.

As shown in FIG. 2A, droop detector 201 can generate voltage Vp at a node 211' based on voltage $V_A$ at node 211. FIG. 2A shows an example where node 211' can be directly coupled to node 211, such that value of voltage Vp can be equal to the value of voltage $V_A$.

Comparator circuit 230 can include comparators (e.g., voltage comparators) 231 and 232. Comparator 231 can compare voltages Vp and $V_{TH\_1}$ and generate a signal Cmp1 (e.g., output signal of comparator 231) having signal levels based on the result of the comparison (e.g., based on the values of voltages Vp and $V_{TH\_1}$). For example, signal Cmp1 can have one signal level (e.g., lower level) when the value of voltage Vp is greater than the value of voltage $V_{TH\_1}$. In another example, signal Cmp1 can have another signal level (e.g., higher level) when the value of voltage Vp is less than the value of voltage $V_{TH\_1}$.

Comparator 232 can compare voltages Vp and $V_{TH\_1}$ and generate a signal Cmp2 (e.g., output signal of comparator 232) having signal levels based on the result of the comparison (e.g., based on the values of voltages Vp and $V_{TH\_2}$).

For example, signal Cmp2 can have one signal level (e.g., lower level) when the value of voltage Vp is greater than the value of voltage $V_{TH\_2}$. In another example, signal Cmp2 can have another signal level (e.g., higher level) when the value of voltage Vp is less than the value of voltage $V_{TH\_2}$.

Output circuit 240 can generate an output signal Droop_DET based on signals Cmp1 and Cmp2. Output circuit 240 can include phase detector circuitry having phase detectors (e.g., edge detectors) 241 and 242, delay circuitry 244, and logic circuitry 245. As shown in FIG. 2A, logic circuitry 245 can include an AND gate that have an inverted input (e.g., an inverter coupled to an input of the AND gate).

Delay circuitry 244 can operate to delay signal Cmp1 by a time delay (e.g., a fraction of a second) and generate a signal (e.g., delayed signal) Cmp1_Dly, Delay circuitry 244 can include circuit delay elements to apply the time delay to signal Cmp1. Thus, signal Cmp1_Dly is a delay version (with respect to time) of signal Cmp1. The time delay applied by delay circuitry 244 can be programmable.

Phase detector 241 can compare signals Cmp1 and Cmp2 to generate a signal Cmp1_Lead (e.g., output signal of phase detector 241) having signal levels based on the result of the comparison (e.g., based on the timing of the edges rising edges) of signals Cmp1 and Cmp2). For example, signal Cmp1_Lead can have one signal level (e.g., lower level) when the rising edge of signal Cmp2 leads (e.g., occurs before) the rising edge of signal Cmp1. In another example, signal Cmp1_Lead can have another signal level (e.g., higher level) when the rising edge of signal Cmp1 leads the rising edge of signal Cmp2.

Phase detector 242 can compare signals Cmp1_Dly and signal Cmp2 to generate a signal Cmp1_Dly_Lead (e.g., output signal of phase detector 242) having signal levels based on the result of the comparison (e.g., based on the timing of the edges (e.g., rising edges) of signals Cmp1 and Cmp2). For example, signal Cmp1_Dly_Lead can have one signal level (e.g., lower level) when the rising edge of signal Cmp2 leads the rising edge of signal Cmp1_Dly. In another example, signal Cmp1_Dly_Lead can have another signal level (e.g., higher level) when the rising edge of signal Cmp1_Dly leads the rising edge of signal Cmp2.

Logic circuitry 245 can generate signal Droop_DET having signal levels based on the levels of Cmp1_Lead and Cmp1_Dly_Lead. As described above, the level of signal Droop_DET can indicate whether a droop in voltage V1 is detected. Timing relationships among signals voltage V1 and signals Cmp1, Cmp2, Cmp1_Dly, and Droop_DET are shown below with reference to FIG. 2C and FIG. 2D.

FIG. 2B shows an example waveform of voltage V1 and signal levels of signals Cmp1 and Cmp2 of droop detector 201 of FIG. 2A, according to some embodiments described herein. FIG. 2B shows an example of a change in voltage V1 where the value of voltage V1 drops below the values of voltages $V_{TH\_1}$ and $V_{TH\_2}$ and then return to an initial value after a time interval. For example, at time T0 in the example of FIG. 2B, the value voltage V1 starts to decrease from an initial value the value before time T0). Between times T1 and T2, the value of voltage V1 is less than the value voltage $V_{TH\_1}$ and greater than the value voltage $V_{TH\_2}$ (e.g., $V_{TH\_2} < V1 < V_{TH\_1}$). Between times T2 and T3, the value of voltage V1 is less than the value voltage $V_{TH\_2}$ (e.g., $V1 < V_{TH\_2}$). Between times T3 and T4, the value of voltage V1 and less than the value voltage $V_{TH\_1}$ (e.g., $V_{TH\_2} < V1 < V_{TH\_1}$) and greater than the value of voltage $V_{TH\_2}$. After time T4, the value voltage V1 is greater than the value of voltage $V_{TH\_1}$ (e.g., $V1 > V_{TH\_1}$) and starts to converge back to the initial value (e.g., the value before time T0) of voltage V1 at time T5.

As shown in FIG. 2B, based on the values of voltages V1 and signal Cmp1 can change (e.g., at time T1) from level 231a to level 231b when the value of voltage V1 is less than the value of voltage $V_{TH\_1}$. Signal Cmp1 can change (e.g., at time T4) from level 231b back to level 231a when the value of voltage V1 is greater than the value of voltage $V_{TH\_1}$.

Signal Cmp2 can change (e.g., at time T2) from level 232a to level 232b when the value of voltage V1 is less than the value of voltage $V_{TH\_2}$. Signal Cmp2 can change (e.g., at time T3) from level 232b back to level 232a when the value of voltage V1 is greater than the value of voltage $V_{TH\_2}$. Comparators 231 and 232. (FIG. 2A) can cause signals Cmp1 and Cmp2, respectively, to change to between signal levels based on the value of voltage V1.

As shown in FIG. 2B, signal Cmp1 has an edge 231' (e.g., rising edge), and signal Cmp2 has an edge 232' (e.g., rising edge). Based on the edges (e.g., 231' and 232') of signals Cmp1 and Cmp2, and the edges of signal Cmp1_Dly (shown in FIG. 2C and FIG. 2D), droop detector 201 (FIG. 2A) can determine whether a change (e.g., a decrease) in the value of voltage V1 is droop or not a droop, as discussed below with reference to FIG. 2C and FIG. 2D.

FIG. 2C shows a timing diagram illustrating timing relationships among signals Cmp1, Cmp2, Cmp1_Dly, and Droop_DET of droop detector 201 of FIG. 2A when a droop is detected, according to some embodiments described herein. As shown in FIG. 2C, signal Droop_DET can have signal levels 250a and 250b. A droop is not detected when signal Droop_DET has signal level 250a. A droop is detected when signal Droop_DET has signal level 250b. Signal levels 250a and 250b of signal Droop_DET are based on the timing relationships among signals Cmp1, Cmp2, and Cmp1_Dly. For example, as shown in FIG. 2C, edges 231' and 232' are two closest rising edges of signals Cmp1 and Cmp2, and edges 231' and 244' are two closest rising edges of signals Cmp1 and Cmp1_Dly. Duration 261 is an amount of time between edges 231' and 232'. Duration 271 is an amount of time between edges 231' and 244'. Duration 261 is less than duration 271 (because edge 232' leads edge 244'). Thus, as shown in FIG. 2C, signal Cmp1 leads signal Cmp2 (e.g., edge 231' occurs before edge 232') and signal Cmp2 leads signal Cmp1_Dly (e.g., edge 232' occurs before edge 244'). Based on the timing shown in FIG. 2C, droop detector 201 (FIG. 2A) causes signal Droop_DET changes from signal level 250a to 250b, indicating that a droop is detected.

FIG. 2D shows a timing diagram illustrating timing relationships among signals Cmp1, Cmp2, Cmp1_Dly, and Droop_DET of droop detector 201 of FIG. 2A when a droop is not detected, according to some embodiments described herein. As shown in FIG. 2D, each signals Cmp1, Cmp2, Cmp1_Dly changes from one signal level to another signal level similar to the example shown in FIG. 2C. This means that the value of voltage V1 drops below the values of voltages $V_{TH\_1}$ and $V_{TH\_2}$. However, unlike the example shown in FIG. 2C, signal Droop_DET in FIG. 2D remains unchanged at signal level 250a, indicating a droop in voltage V1 is not detected. The difference between the examples of FIG. 2C and FIG. 2D is the timing at which signal Cmp2 changes its signal level relative to the change in the signal level of signal Cmp1_Dly.

FIG. 2D shows duration 262 (which is an amount of time between edges 231' and 232') and duration 272 (is an amount of time between edges 231' and 244'). Duration 262 is greater than duration 271 (because edge 244' leads edge 232'). Thus, as shown in FIG. 2D, signal Cmp1 leads signal Cmp2 (e.g., edge 231' occurs before edge 232') similar to the example of FIG. 2C. However, unlike the example of FIG. 2C, signal Cmp1_Dly in FIG. 2D also leads signal Cmp2 (e.g., edge 244' occurs before edge 232'). Therefore, in FIG. 2D, both signal Cmp1 and Cmp1_Dly lead signal Cmp2 (e.g., edge 231' and 244' occur before edge 232'). Based on the timing of Cmp1, Cmp2, and Cmp1_Dly shown in FIG. 2D, droop detector 201 (FIG. 2A), keeps signal Droop_DET unchanged at the same signal level (e.g., at signal level 250a shown in FIG. 2D), indicating that a droop is not detected.

Using signal Cmp_dly (as shown in FIG. 2A, FIG. 2C, and FIG. 2D) in addition to signals Cmp1 and Cmp2 allows droop detector 201 to determine whether voltage V1 dropping below voltage $V_{TH\_2}$ (e.g., between times T2 and T3 in FIG. 2B) is caused by an unintentional event or an intentional event (e.g., a normal event). Examples of an unintentional event include a surge in current consumption, excessive supply noise, and other unintentional events. Such unintentional events can cause the value of voltage V1 to be less than the value of voltage $V_{TH\_2}$. Examples of an intentional event include a change between different operating modes of the function unit that uses voltage V1 or other intentional events. For example, as described above, voltage V1 may be used as a supply voltage of a functional unit (e.g., functional unit 102 of FIG. 1). The functional unit may operate at different operating modes at different times. The different operating modes may use supply voltages of different values. Thus, the functional unit may change the value of voltage V1 from a higher value to a lower value when the function unit switches from one operating mode to another operating mode. Such a lower value (an intentionally changed value) can be less than the value of voltage $V_{TH\_2}$ (FIG. 2B).

Thus, as described above, both unintentional and intentional events can cause the value of voltage V1 to be less than the value of voltage $V_{TH\_2}$. However, an intentional event may cause the value of voltage V1 to reach the value of voltage $V_{TH\_2}$ in more time than that of an unintentional event. For example, in FIG. 2B, the slope (e.g., rate of change) of voltage V1 between times T1 and T2 in an intentional event can be more gradual (e.g., a slow droop) than the slope (e.g., fast droop) of voltage V1 between times T1 and T2 in an unintentional event. A relatively gradual slope of voltage V1 can be caused by slow changing events (e.g., intentional events). A relatively steeper slope of voltage V1 can be caused by fast changing events (unintentional events). This means that the duration (e.g., duration 261 in FIG. 2C) of edges 231' and 232' (of signals Cmp1 and Cmp2, respectively) between times T1 and T2 (FIG. 2B) in an unintentional event (e.g., the example of FIG. 2B) can be less than the duration (e.g., duration 262 in FIG. 2D) of edges 231' and 232' between times T1 and T2 (FIG. 2B) in an intentional event (e.g., the example of FIG. 2C). Thus, the rate of change (e.g., the rate corresponding to duration 261 in FIG. 2C) of voltage V1 in an unintentional event can be less than the rate of change (e.g., the rate corresponding to duration 262 in FIG. 2D) of voltage V1 in an intentional event (e.g., corresponding to duration 261).

The timing of signal Cmp1_Dly, as shown in FIG. 2C, and FIG. 2D, allows droop detector 201 to determine whether the duration (e.g., duration 261 or 262) between edges 231' and 232' of respective signals Cmp1 and Cmp2 is associated with an unintentional event or an intentional event. The time delay applied by delay circuity 244 (FIG. 2A) can be selected to set the timing for signal Cmp1 so that unintentional events and intentional events can be determined by droop detector 201. This allows droop detector 201 to correctly activate (e.g., cause a change in the signal level) or not to activate (e.g., not cause a change in the signal level) signal Droop_DET when the value of signal V1 drops below the value of voltage $V_{TH\_2}$, depending on whether the drop is intentional or unintentional.

As described above with reference to FIG. 2A through FIG. 2D, droop detector 201 can generate signal Droop_DET to indicate whether a droop in voltage V1 (e.g., a supply voltage) is detected, Droop detector 201 uses voltages Vp, $V_{TH\_1}$, and $V_{TH\_2}$ (FIG. 2A) to generate signals Cmp1, Cmp2, and Cmp1_dly in order to generate signal Droop_DET. Droop detector 201 generates voltages Vp, $V_{TH\_1}$, and $V_{TH\_2}$ from voltage V1 without using a reference voltage (e.g., without using a voltage $V_{REF}$). Thus, in detecting a droop in voltage V1, droop detector 201 uses a self-referenced scheme to generate a signal (e.g., signal Droop_DET) to indicate whether a droop in voltage V1 is detected.

Further, as described above with reference to FIG. 2A through FIG. 2D, droop detector 201 can detect whether a droop (relative to a threshold voltage (e.g., voltage $V_{TH\_2}$)) has occurred in voltage V1 without the knowledge of the value of voltage V1 (e.g., the value of voltage V1 can be unknown to droop detector 201) during the time period (e.g., between time T0 and T5 in FIG. 2B) of the operation that droop detection 201 operates to detect a droop in voltage V1.

The techniques described above with reference to FIG. 2A through 2D have improvements over some conventional techniques that involve detection of a droop in a voltage (e.g., a supply voltage). For example, some conventional techniques of droop detection use a reference voltage scheme and extensive calibration, and cannot distinguish between faster voltage change events and slower voltage change events. In contrast, droop detector 201 uses a different scheme (e.g., a reference-less scheme) that may simplify operation of circuity of droop detector 201. Further, droop detector 201 can correctly determine whether a droop has occurred based on the ability of droop detector 201 to distinguish between the rate of change of voltage V1 in unintentional events (e.g., fast AC change events) and rate of change of voltage V1 in intentional events (e.g., slow DC change events). Moreover, by detecting a droop in a timely fashion, droop detector 201 can be used to improve operations of other circuitry, such as allowing a reduction in the guard-banding of minimum operating voltage (e.g., Vmin) in the functional unit or other circuitry.

FIG. 3A shows a schematic diagram of a droop detector 301 including another reference-less scheme, according to some embodiments described herein. Droop detector 301 can correspond to droop detector 101 of FIG. 1. As shown in FIG. 3A droop detector 301 can include an input node 391 to receive a voltage (e.g., input voltage) V1 and a ground node 399 to receive a ground potential (e.g., voltage Vss). Voltage V1 can include a supply voltage (e.g., Vcc) used by another component (e.g., functional unit 102 of FIG. 1). Thus, input node 391 can include a supply node (e.g., supply node that provides voltage Vcc to functional unit 102 of FIG. 1).

Droop detector 301 can include nodes 392 and 393 to receive voltages V2 and V3, respectively. One or both of voltages V2 and V3 can include a supply voltage of droop detector 301. Thus, one or both of nodes 392 and 393 can include a supply node of droop detector 301. Two or more of voltages V1, V2, and V3 can have the same value or different values. For example, voltages V2 and V3 can have the same value, which can be different from the value of voltage V1.

Droop detector 301 can include a circuit portion 310, a capacitor C having terminals (e.g., plates) 321 and 322, and a comparator (e.g., voltage comparator) 330. Droop detector 301 can generate a signal Droop_DET at a node (e.g., output node) 350.

As shown in FIG. 3A, circuit portion 310 can include resistors R7, R8, R9, and R10. Resistors R7 and R8 can be coupled in series with each other and coupled between node 393 and ground node 399. Resistors R9 and R10 can be coupled in series with each other and coupled between node 393 and ground node 399. Resistors R7, R8, R9, and R10 can be variable resistors, such that the values of each of resistors R7, R8, R9, and R10 can be changed. For example, the values of resistors R7, R8, R9, and R10 can be programmable after resistors R7, R8, R9, and R10 are formed. Resistors R7, R8, R9, and R10 may themselves be formed from some combination of individual resistors whose effective resistance is programmable.

Comparator 330 can include nodes (e.g., input nodes) 331 and 332. Node 331 can be coupled to a node between resistors R7 and R8 and to terminal 322 of capacitor C. Node 332 can be coupled to a node between resistors R9 and R10.

Circuit portion 310 can generate a voltage Vp' based on a voltage at the node between resistors R7 and R8. Capacitor C and resistors R7 and R8 can form a high pass filter. The high pass filter can operate to block a gradual decrease in the value of voltage V1 at node 391 from appearing at node 331, and allow a fast decrease in the value of voltage V1 at node 391 to pass to (e.g., to appear at) node 331. A gradual decrease in the value of voltage V1 can be a slow DC change caused by an intentional event. A list decrease in the value of voltage V1 can be fast AC change caused by an unintentional event. By blocking a gradual decrease in the value of voltage V1 at node 391 from appearing at node 331 and by allowing a fast decrease in the value of voltage V1 at node 391 to pass to node 331, droop detector 301 can correctly determine whether a change in the value of voltage V1 is a droop (e.g., caused be an unintentional event) or not a droop (e.g., caused by an intentional event).

As shown in FIG. 3A, circuit portion 310 can generate a voltage (e.g., threshold voltage) $V_{TH}$ based on a voltage at a node between resistors R9 and R10. The value of voltage $V_{TH}$ can selected, such that a droop in voltage V1 (passing to node 331) can be detected based on the values of voltages $V_{TH}$.

In operation, droop detector 301 can compare voltages Vp' and $V_{TH\_1}$ and generate a signal Droop_DET having signal levels based on the result of the comparison (e.g., based on the values of voltages Vp' and $V_{TH}$). For example, signal Droop_DET can have one signal level (e.g., lower level) when the value of voltage Vp' is greater than the value of voltage $V_{TH}$. In another example, signal Droop_DET can have another signal level (e.g., higher level) when the value of voltage Vp' is less than the value of voltage $V_{TH}$.

FIG. 3B shows a timing diagram illustrating relationships between signal Droop_DET of FIG. 3A and the values of voltages V1, Vp', and $V_{TH}$ of droop detector 301 of FIG. 3A, according to some embodiments described herein. As shown in FIG. 3B, signal Droop_DET can have signal levels 350a and 350b. A droop is not detected when signal Droop_DET has signal level 350a. A droop is detected when signal Droop_DET has signal level 350b. Signal levels 350a and 350b of signal Droop_DET are based on the values of voltage $V_{TH}$ and the value of voltage Vp' (which is based on the value of voltage V1). As shown in FIG. 3B, a droop occurs between times Ti and Tj when the value of voltage Vp' is less than the value of voltage $V_{TH}$.

Droop detector 301 can have improvements over some conventional techniques associated with voltage droop detection. Such improvements are similar to those of droop detector 201 of FIG. 2A.

FIG. 4A shows a schematic diagram of a droop detector 401 including another reference-less scheme, according to some embodiments described herein. Droop detector 401 can correspond to droop detector 101 of FIG. 1. As shown in FIG. 4A droop detector 401 can include nodes 491, 492, 493, and 499 that can be similar (or identical) to nodes 391, 392, 393, and 399, respectively, of FIG. 3. For example, as shown in FIG. 4A, nodes 491, 492, and 493 can receive voltages V1, V2, and V3 that can be similar (or identical) to voltages V1, V2, and V3 of FIG. 3A.

As shown in FIG. 4A, droop detector 401 can include a circuit portion 410, a capacitor C having terminals (e.g., plates) 421 and 422, and a comparator (e.g., voltage comparator) 430. Droop detector 401 can generate a signal Droop_DET at a node (e.g., output node) 450.

Circuit portion 410 can include resistors R11, R12, and R13 coupled in series with each other and coupled between node 493 and ground node 499. Resistors R11, R12, and R13 can be variable resistors, such that the values of each of resistors R11, R12, and R13 can be changed. For example, the values of resistors R11, R12, and R13 can be programmable after resistors R11, R12, and R13 are formed. Resistors R11, R12 and R13 may themselves be formed from some combination of individual resistors whose effective resistance is programmable. Circuit portion 410 can include a unity gain buffer (amplifier) 412 coupled between terminal 422 of capacitor C and a node between resistors R11 and R12. Unity gain buffer (amplifier) 412 can operate to isolate terminal 422 of capacitor C from a node between resistors R11 and R12. This can prevent noise (e.g., kick-back noise) from AC-coupling from capacitor C to be introduced at circuit portion 410.

Comparator 430 can include nodes (e.g., input nodes) 431 and 432. Node 432 can be coupled to a node between resistors R12 and R13. Node 431 can be coupled to a node between resistors R11 and R12 and to terminal 422 of capacitor C.

Circuit portion 410 can generate a voltage Vp" based on a voltage at terminal 422 of capacitor C. Circuit portion 410 and capacitor C can form a high pass filter. The high pass filter can operate to block a gradual decrease in the value of voltage V1 at node 491 from appearing at node 431, and allow a fast decrease in the value of voltage V1 at node 491 to pass to (e.g., to appear at) node 431. A gradual decrease in the value of voltage V1 can be a slow DC change caused by an intentional event. A fast decrease in the value of voltage V1 can be fast AC change caused by an unintentional event. By blocking a gradual decrease in the value of voltage V1 at node 491 from appearing at node 431 and by allowing a fast decrease in the value of voltage V1 at node 491 to pass to node 431, droop detector 401 can correctly determine whether a change in the value of voltage V1 is a droop (e.g., caused be an unintentional event) or not a droop (e.g., caused by an intentional event).

Circuit portion 410 can generate a voltage (e.g., threshold voltage) $V_{TH}$ based on a voltage at a node between resistors R12 and R13. The value of voltage $V_{TH}$ can be selected, such that a droop in voltage V1 (passing to node 431) can be detected based on the values of voltages $V_{TH}$.

In operation, droop detector 301 can compare voltages Vp" and $V_{TH}$ and generate a signal Droop_DET having signal levels based on the result of the comparison (e.g., based on the values of voltages Vp" and $V_{TH}$). For example, signal Droop_DET can have one signal level (e.g., lower level) when the value of voltage Vp" is greater than the value of voltage $V_{TH}$. In another example, signal Droop_DET can have another signal level (e.g., higher level) when the value of voltage Vp" is less than the value of voltage $V_{TH}$.

FIG. 4B shows a timing diagram illustrating relationships between signal Droop_DET of FIG. 4A and the values of voltages V1 and Vp", and $V_{TH}$ of the droop detector 301 of FIG. 4A, according to some embodiments described herein. As shown in FIG. 4B, signal Droop_DET can have signal levels 450a and 450b. A droop is not detected when signal Droop_DET has signal level 450a. A droop is detected when signal Droop_DET has signal level 450b. Signal levels 450a and 450b of signal Droop_DET are based on the values of voltage $V_{TH}$ and the value of voltage Vp" (which is based on the value of voltage V1). As shown in FIG. 4B, a droop occurs between times Tm and Tn when the value of voltage Vp" is less than the value of voltage $V_{TH}$.

Droop detector 401 can have improvements over some conventional techniques associated with voltage droop detection. Such improvements are similar to those of droop detector 201 of FIG. 2A.

Figure 5A:
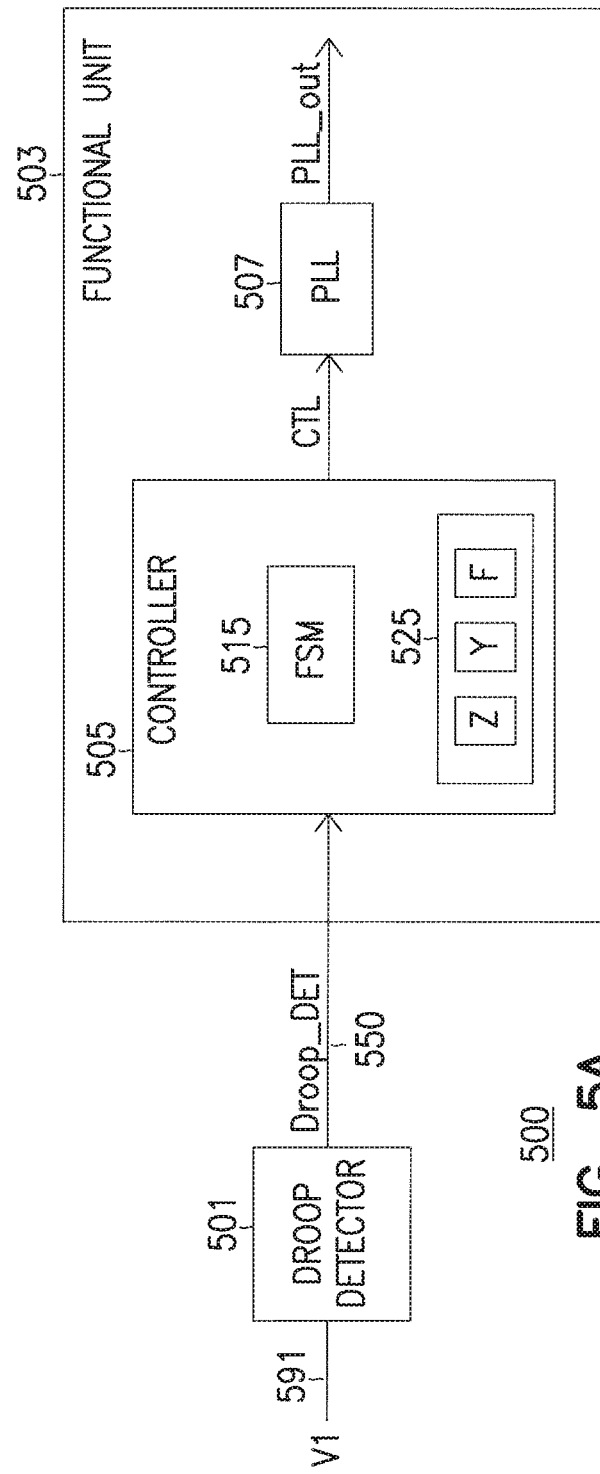
FIG. 5A shows an apparatus including a droop detector, and a functional unit including a controller and a phase-locked loop (PLL), according to some embodiments described herein.

FIG. 5A shows an apparatus 500 including a droop detector 501, and a functional unit 503 including a controller 505 and a PLL 507, according to some embodiments described herein. Droop detector 501 can include any of droop detectors 101, 201, 301, and 401 described above with reference to FIG. 1 through FIG. 4B. Thus, droop detector 501 of FIG. 5A can include circuit elements and operations of any of droop detectors 101, 201, 301, and 401. As shown in FIG. 5A, droop detector 501 can include a node (e.g., input node) 591 to receive a voltage V1 and a node (e.g., output node) 550 to provide a signal Droop_DET. Voltage V1 and signal Droop_DET can be similar (or identical) to voltage V1 and signal Droop_DET of FIG. 1 through FIG. 4B.

As shown in FIG. 5A, controller 505 and a PLL 507 can be part of PLL circuitry included in functional unit 503, which can operate as a frequency synthesizer where the frequency of signal PLL_out (e.g., output signal of PLL 507) can be adaptively controlled (e.g., adjusted) based on variations in operating conditions of apparatus 500. Part of controlling PLL 507 in response to such variations (e.g., a droop in voltage V1) is described below with reference to FIG. 5A and FIG. 5B.

As shown in FIG. 5A, PLL 507 can operate to generate PLL_out, which can be used as a clock signal for other components (not shown) of apparatus 500. Signal PLL_out can have a particular frequency (e.g., predetermined normal frequency). PLL 507 can operate in a synchronous mode, asynchronous mode, or both. For example, PLL 507 can operate in a closed-loop in the synchronous mode and in an open-loop in the asynchronous mode. In some operating conditions, PLL 507 can cause the frequency of signal PLL_out to change (e.g., decrease or increase) in order to maintain proper operation of PLL. For example, PLL 507 can operate to adjust e.g., decrease) the frequency of signal PLL_out when a droop in voltage V1 is detected. The signal level of signal Droop_DET can indicate whether a droop in voltage V1 is detected. PLL 507 can operate in a PLL normal state and in a slowdown state. PLL 507 can operate in the PLL normal state when a droop in voltage V1 is not detected. PLL 507 can operate in the PLL slowdown state when a droop in voltage V1 is detected. In the PLL slowdown state, PLL 507 can cause the frequency of signal PLL_out to be at a lower frequency for a duration. PLL 507 can enter and exit the PLL slowdown state at specific timing based on information CTL generated by controller 505.

Controller 505 can include a finite state machine (FSM) 515 or other components that can be configured to perform operations of controller 505, PLL 507, or both. FIG. 5A shows an example where controller 505 is in a block separate from PLL 507. However, controller 505 can be part of PLL 507, such that operations of controller 505 can also be part of operations of PLL circuitry that includes PLL 507. Controller 505 can generate control information CTL (e.g., a signal or signals) to control some of the operations of PLL 507. Control information CTL can be generated based on control information Z, Y, and F. Information Z, Y, and F can be programmable. Controller 507 can include a memory unit 525 to store the value for information Z, Y, and F. Memory unit 525 can include registers, memory cells, or memory elements that can store information Z, Y, and F. The values of information Z, Y, and F can be selected based in part on the relationships between signal Droop_DET and voltage V1, as described below.

Figure 5B:
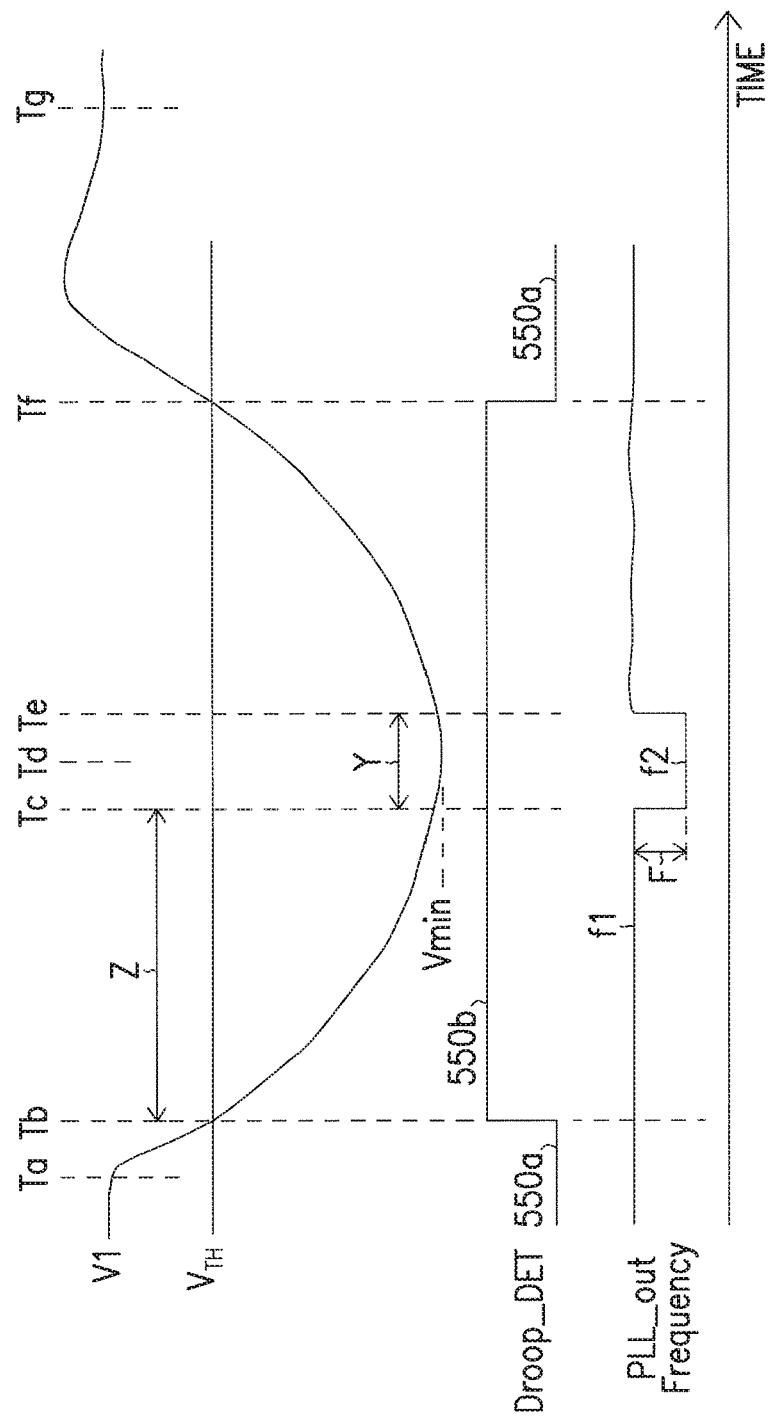
FIG. 5B shows a timing diagram illustrating relationships between a voltage and some of the signals of the apparatus of FIG. 5A, according to some embodiments described herein.

FIG. 5B shows a timing diagram illustrating relationships between voltage V1, signal Droop_DET, voltage (e.g., threshold voltage) $V_{TH}$, and information Z, Y, and F of FIG. 5A, according to some embodiments described herein. As shown in FIG. 5B, voltage V1 can have an initial value before time Ta. At time Ta, the value of voltage V1 can start to decrease. At time Tb, the value of voltage V1 reaches the value of voltage $V_{TH}$. Voltage can be similar to (or the same as) voltage $V_{TH\_2}$ of FIG. 2A or voltage $V_{TH}$ of FIG. 3A or FIG. 4A. As shown in FIG. 5B, between times Tb and Td, the value of voltage V1 is less than the value of voltage $V_{TH}$. The value of voltage V1 may reach a voltage (e.g., a minimum operating voltage of functional unit 503 in FIG. 5A or 102 in FIG. 1) Vmin at time Td. Between times Td and Tf, the value of voltage V1 increases and reaches the value of voltage $V_{TH}$ at time Tf After time Tf, the value of voltage V1 is greater the value voltage $V_{TH}$ and returns to the initial value after time Tg.

As shown in FIG. 5B, signal Droop_DET can have signal levels 550a and 550b based on the value of voltage V1. For example, signal Droop_DET can have signal level 550a when the value of voltage V1 is greater than the value of voltage $V_{TH}$ (e.g., before time Tb and after time Tf). Signal Droop_DET can have signal level 550b when the value of voltage V1 is less than the value of voltage $V_{TH}$ (e.g., between times Tb and Tf). A droop is not detected when signal Droop_DET has signal level 550a. A droop is detected when signal Droop_DET has signal level 550b.

The values of information Z and Y can be selected (e.g., set) based on the relationships between voltage V1 and signal Droop_DET. The values of information Z and information Y can be the same or can be different.

The value of information Z can be based on the amount of time lapsed of a duration from time Tb to time Tc. The value of information Y can be based on the amount of time lapsed of a duration from time Tc to time Te. The value of each of information Z and information Y can be programmable (e.g., selected and stored in memory unit 525 (FIG. 5A)). For example, the value information Z stored in memory unit 525 (FIG. 5A) can be a number of counts. Each count can correspond to one period of a periodical signal (e.g., clock signal, not shown) that is used to generate a number of counts based on information Z. For example, Z=D1/P1, where D1 represents the amount of time of the duration between times Tb and Tc (FIG. 5B), and P is the period (e.g., a fraction of a second) of the periodical signal. Similarly, the value information Y stored in memory unit 525 (FIG. 5A) can be a number of counts. Each count can correspond to one period of a periodical signal (e.g., clock signal, not shown) that is used to generate a number for the counts based on information Y. For example, Y=D2/P2, where D2 represents the amount of time of the duration between times Tc and Te (FIG. 5B), and P2 is the period (e.g., a fraction of a second) of the periodical signal.

The values of information F can be selected such that the value of frequency f2 can be less than frequency f1 by a value (e.g., a percentage). Each of frequency f1 and frequency f2 can be measured in hertz units. Frequency f1 can be a frequency (e.g., normal frequency) of signal PLL_out during a normal operation of PLL 507 (e.g., when PLL 507 is in a PLL normal state). Frequency f2 can be a frequency (e.g., slowdown frequency) of signal PLL_out during a slowdown operation of PLL 507 (e.g., when PLL 507 is in a PLL slowdown state). For example, PLL 507 can be in a PLL normal state before time Tc (e.g., between times Ta and Tc) and after time Te (e.g., between times Te and Tg), and PLL 507 can be in a PLL slowdown state between times Tc and Te.

The following description refers to FIG. 5A and FIG. 5B. In operation, droop detector 503 (FIG. 5A) can cause signal Droop_DET (FIG. 5B) to change (e.g., at time Tb) from signal level 550a to signal level 550b (to indicate that a droop in voltage V1 is detected) when voltage V1 has a value less than the value of voltage $V_{TH}$. Signal Droop_DET can remain at signal level 550b between times Tb and Tf when voltage V1 has a value less than the value of voltage $V_{TH}$. Droop detector 503 can cause signal Droop_DET to change (e.g., at time T1) from signal level 550b to signal level 550a (to indicate that the droop in voltage V1 is finished) when voltage V1 has a value greater than the value of voltage $V_{TH}$.

In response to the change in the signal level of signal Droop_DET at time Tb (indicating that a droop is detected), controller 505 can generate information Z (e.g., which can include an enable signal). In response to information CTL, PLL 507 can enter the PLL slowdown state at time Tc (e.g., based on the programmable value of information Z). Thus, as shown in FIG. 5B, PLL 507 can enter the PLL slowdown state after an amount of time has lapsed (e.g., the amount of time of the duration between times Tb and Tc) from the time (e.g., Tb) at which signal Droop_DET changes from signal level 550a to signal level 550b. As shown in FIG. 5B, the amount of time of the duration between times Tb and Tc can be based on the information Z (e.g., programmed value of information Z in memory unit 525 (FIG. 5A).

PLL 507 can decrease the frequency of signal PLL_out at time Tc when PLL 507 enters the PLL slowdown state. For example, PLL 507 can decrease the frequency of signal PLL_out from frequency f1 to frequency f2. PLL 507 can keep the frequency of signal PLL_out at frequency t2 for an amount of time the duration between times Tc and Te) while PLL 507 is in the PLL slowdown state.

PLL 507 can exit the PLL slowdown state at time Te. Thus, as shown in FIG. 5B, PLL 507 can exit the PLL slowdown state after an amount of time has lapsed (e.g., the amount of time of the duration between times Tc and Te) from the time (e.g., Tc) at which the frequency of signal PLL-out changes from frequency f1 to frequency f2. As shown in FIG. 5B, the amount of time between times Tc and Te can be based on the information Y (e.g., programmed value of information Y in memory unit 525 (FIG. 5A).

PLL 507 can include a digitally controlled oscillator (DCO), not shown in FIG. 5A, that can include driver circuity in current paths (e.g., parallel current paths (e.g., legs)) of the DCO. Such driver circuity can include a number of drivers that can be adaptively controlled. In response to a droop in voltage V1 being detected, PLL 507 can turn off one or more of such drivers to reduce the overall drive strength of the circuitry of the DCC). Reducing drive strength can cause the frequency of signal PLL_out to decrease from frequency f1 (a frequency before a droop in voltage V1 is detected) to frequency f2 (a frequency after a droop in voltage V1 is detected). As described above, the relationship between frequencies f1 and f2 can be based on the programmable value of information F. Thus, in the example here, the number of drivers to be turned off (to cause the frequency of signal out to change from frequency f1 to frequency f2) can be based on the value of information F. PLL 507 can keep the number of turned-off drivers to remain turned off for a duration between times Tc and Te (e.g., based on the programmable value of information Y). Since PLL 507 is a control loop, it will attempt to correct the frequency of signal PLL_out back to frequency f1. For the duration between times Tc and Te, PLL 507 can optionally switch to either an open loop state to avoid having the loop correct the frequency of signal PLL_out back to frequency f1 or switch to a lower bandwidth setting to reduce how quickly the loop starts correcting the frequency of signal PLL_out back to frequency f1.

PLL 507 can turn on the same drivers (that were turned off in the PLL slowdown state) when PLL 507 exits the PLL slowdown state in order to increase the frequency of signal PLL_out (from frequency f2 to frequency f1) when PLL 507 exits the PLL slowdown state. This allows the frequency of signal PLL_out to return to the same frequency ((e.g., frequency f1) before the droop in voltage V1 was detected.

The above description discusses PLL 507 that includes a DCO as an example (e.g., when PLL is digital PLL). However, a structure different from a DCO can be used. For example, in an alternative structure, PLL 507 can include a voltage-controlled oscillator (VCO), such as when PLL 507 is an analog PLL, where signal PLL_out can be generated from the VCO. In the alternative structure PLL 507 can also control the VOC in response to a droop in voltage V1 being detected (in order to decrease the frequency of signal PLL_ out from frequency f1 to frequency f2) based on information Z, Y, and F and timing similar to that described above. For example, in the alternative structure, PLL 507 can adjust the current strength in the VCO or the amount of capacitance in the VCO in order to adjust (e.g., decrease and then increase) the frequency of signal PLL_out in response to a droop in voltage V1 being detected.

The values of information Z and information Y as described above are programmable and can be set to be greater than zero. Such setting (e.g., Z>0 and Y>0) can be applicable to some mode (e.g., synchronous mode) of transferring data to and/or from functional unit 503. However, in some other modes (e.g., asynchronous mode) of transferring data to and/or from functional unit 503, the value of information Z can be set to zero (e.g., Z=0) and the value of information Y can be set to represent a duration between times Tb and Te, or alternatively a duration from time Tb to any time between times Td and Tf. In the setting where Z=0, PLL 507 can enter the PLL slowdown state at time Tb (instead of at time Tc) when the droop in voltage V1 is detected (e.g., at time Tb).

During the PLL slowdown state, PLL 507 may attempt to correct for any phase error (and hence, cause a change in frequency). This could lower the benefit of the techniques described herein. However, this can be avoided by either continuing to operate PLL 507 in closed loop but lowering the bandwidth or by operating PLL 507 in open loop. In analog PLL (e.g., when PLL 507 is an analog PLL), this may be accomplished by disabling the phase frequency detector (PFD) in PLL 507 during the PLL slowdown state. In a digital PLL (e.g., when PLL 507 is digital PLL), this may be accomplished by holding the codes (e.g., fine codes in PLL 507) at their previous value.

When the PLL slowdown state is exited, the system (e.g., the system that includes PLL 507) may or may not require that the average frequency be preserved. For systems that require the average frequency to be preserved, PLL 507 can switch to closed loop if it was operating in open loop during PLL slowdown state. If PLL 507 was previously operating in closed loop with potentially reduced bandwidth, then PLL 507 can switch back to normal bandwidth settings either immediately on exiting the PLL slowdown state or at some programmable amount of time after exiting the PLL slowdown state. For systems that do not require the average frequency to be preserved, PLL 507 can ignore the accumulated phase error by aligning the feedback clock to the reference clock on exiting the PLL slowdown state.

The techniques described above with reference to FIG. 5A and FIG. 5B have improvements over some conventional techniques associated with clock-data compensation, which can involve PLLs and frequency synthesis. For example, some conventional techniques for analog PLLs inject a portion of the noisy main supply (e.g., Vcc) into the regulated supply voltage used in components (e.g., voltage-controlled oscillator (VCO)) of the PLL. Such noise injection can cause the clock in PLL in the conventional techniques to immediately slow down. Thus, the PLLs in the conventional techniques may be limited to relatively higher supply noise resonance frequencies. Further, since the clock slows down immediately in response to noise in the main supply, the system in the conventional techniques could accumulate a large phase error if the supply noise resonance frequency is low enough. Moreover, injecting noise directly into the regulated supply voltage limits the value of the main supply due to headroom requirements.

Some other conventional techniques of frequency synthesis involve switching first-in first-out (FIFO) circuitry from synchronous mode to asynchronous mode, opening the PLL loop, changing the frequency, and then closing the PLL loop after a certain number of cycles. In such techniques, opening and then closing the PLL loop and switching the FIFO circuitry between synchronous and asynchronous modes is complex and it is difficult to maintain the average frequency.

The techniques described above with reference to FIG. 5A and FIG. 5B allow enabling adaptive frequency synthesis across a wide range of supply noise resonance frequencies, including relatively lower supply noise resonance frequencies in comparison to some conventional techniques. The described techniques can also support either synchronous or asynchronous clocking architectures. The described techniques can help maintain the average frequency (e.g., by operating in synchronous clocking and keeping the PLL in closed loop). Further, by detecting a droop in the supply voltage (e.g., voltage V1), as described above, and then adjusting operation of circuitry in the PLL (e.g., turning off drivers in DCO of the PLL), the value of the supply voltage may be flexible (e.g., not limited to a value used in some conventional techniques).

Moreover, as described above, PLL 507 can be configured (e.g., based on the programmable value of information Z) to enter the PLL slowdown mode at specific time (e.g., time Tc) after an amount of time has lapsed from the time a droop in voltage V1 is detected. A delay in entering the PLL slowdown mode allows dealing with a wide range of supply noise resonance frequencies by ensuring that clock slowdown (e.g., changing from frequency f1 to frequency f2) starts before voltage V1 reaches a droop minimum (e.g., the value of Vmin). This also reduces phase error accumulation in PLL 507 and can allow engaging architectural throttling. Plus, keeping the frequency of signal PLL_out at a lower frequency (e.g., f2<f1) for a programmable duration (e.g., based on the programmable value of information Y) can limit phase error accumulation in a synchronous system.

Figure 6:
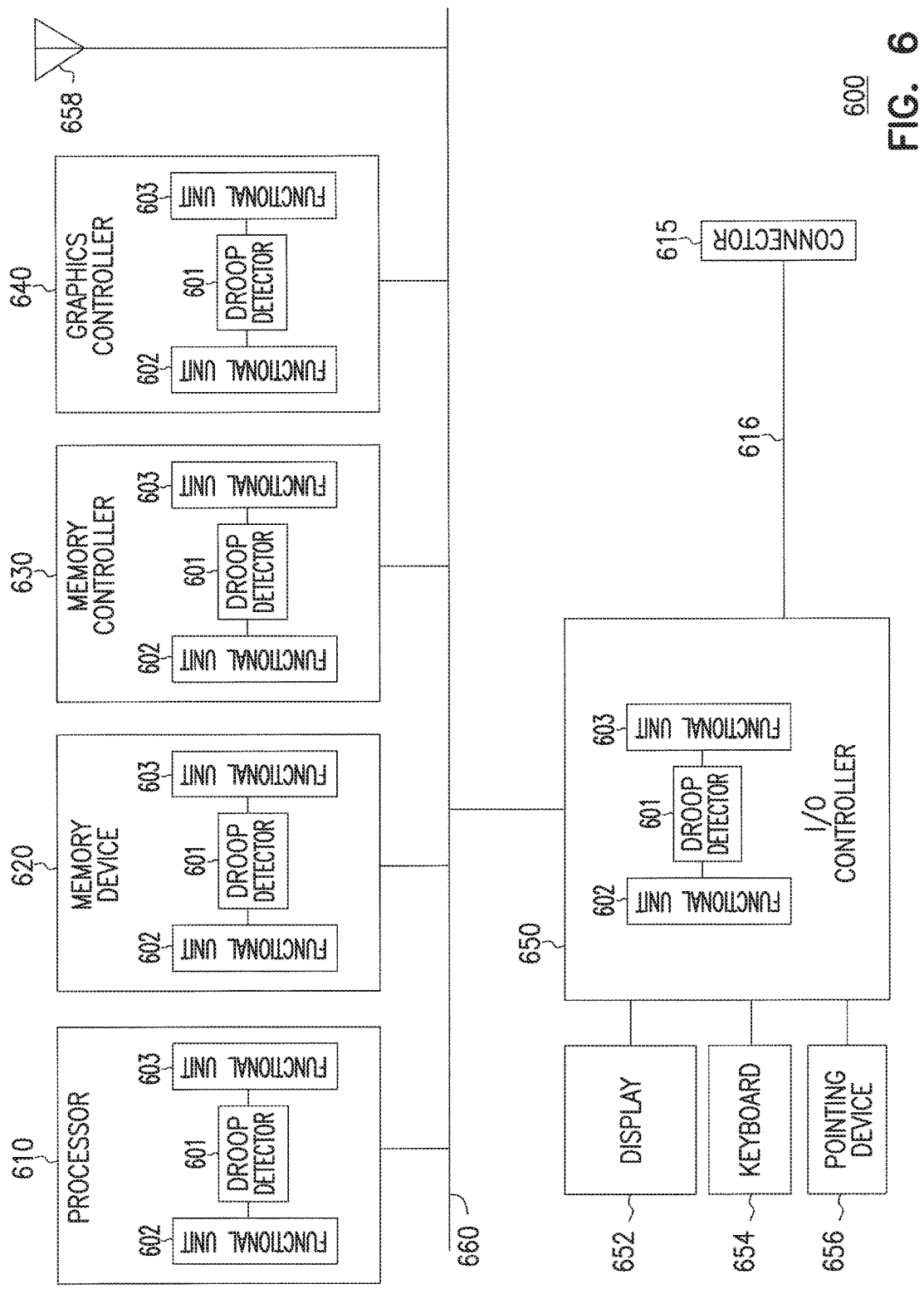
FIG. 6 shows an apparatus in the form of a system (e.g., electronic system), according to some embodiments described herein.

FIG. 6 shows an apparatus in the form of a system (e.g., electronic system) 600, according to some embodiments described herein. System 600 can include or be included in a computer, a tablet, or other electronic systems. As shown in FIG. 6, system 600 can include a processor 610, a memory device 620, a memory controller 630, a graphics controller 640, an input/output (I/O) controller 650, a display 652, a keyboard 654, a pointing device 656, at least one antenna 658, a connector 615, and a bus 660 (e.g., conductive lines formed on a circuit board (not shown) of system 600).

Each of processor 610, memory device 620, memory controller 630, graphics controller 640, and I/O controller 650 can include an IC chip.

In some arrangements, system 600 does not have to include a display. Thus, display 652 can be omitted from system 600. In some arrangements, system 600 does not have to include any antenna. Thus, antenna 658 can be omitted from system 600.

Processor 610 can include a general-purpose processor or an ASIC. Processor 610 can include a central processing unit (CPU).

Memory device 620 can include a dynamic random access memory (DRAM) device, a static random access memory (SRAM) device, a flash memory device, phase change memory, a combination of these memory devices, or other types of memory. FIG. 6 shows an example where memory device 620 is a stand-alone memory device separated from processor 610. In an alternative arrangement, memory device 620 and processor 610 can be located on the same die. In such an alternative arrangement, memory device 620 is an embedded memory in processor 610, such as embedded DRAM (eDRAM), embedded SRAM (eSRAM), embedded flash memory, or another type of embedded memory.

Display 652 can include a liquid crystal display (LCD), a touchscreen (e.g., capacitive or resistive touchscreen), or another type of display. Pointing device 656 can include a mouse, a stylus, or another type of pointing device.

I/O controller 650 can include a communication module for wired or wireless communication (e.g., communication through one or more antennas 658). Such wireless communication may include communication in accordance with WiFi communication technique, Long Term Evolution Advanced (LTE-A) communication technique, or other communication techniques.

I/O controller 650 can also include a module to allow system 600 to communicate with other devices or systems in accordance with one or more of the following standards or specifications (e.g., I/O standards or specifications), including Universal Serial Bus (USB), DisplayPort, (DP), High-Definition Multimedia Interface (HDMI), Thunderbolt, Peripheral Component Interconnect Express (PCIe), Ethernet, and other specifications.

Connector 615 can be arranged (e.g., can include terminals, such as pins) to allow system 600 to be coupled to an external device (or system). This may allow system 600 to communicate (e.g., exchange information) with such a device (or system) through connector 615. Connector 615 may be coupled to I/O controller 650 through a connection 616 (e.g., a bus).

Connector 615, connection 616, and at least a portion of bus 660 can include elements (e.g., conductive terminals, conductive lines, or other conductive elements) that conform to at least one of USB, DP, HDMI, Thunderbolt, PCIe, Ethernet, and other specifications.

FIG. 6 shows the elements (e.g., devices and controllers) of system 600 arranged separately from each other as an example. For example, each of processor 610, memory device 620, memory controller 630, graphics controller 640, and I/O controller 650 can be located on a separate IC chip (e.g., separate semiconductor dies). In some arrangements, two or more elements (e.g., processor 610, memory device 620, graphics controller 640, and I/O controller 650) of system 600 can be located on the same die (e.g., same IC chip) that can form a system-on-chip (SoC).

As shown in FIG. 6, each of processor 610, memory device 620, memory controller 630, graphics controller 640, and I/O controller 650 can include functional units 602 and 603 and a droop detector 601. Functional unit 602 can include functional unit 102 of FIG. 1. Functional unit 603 can include functional unit 103 FIG. 1 or functional unit 503 of FIG. 5A. Droop detector 601 can include any of droop detectors 101, 201, 301, 401, and 501 described above with reference to FIG. 1 through FIG. 5B.

Figure 7:
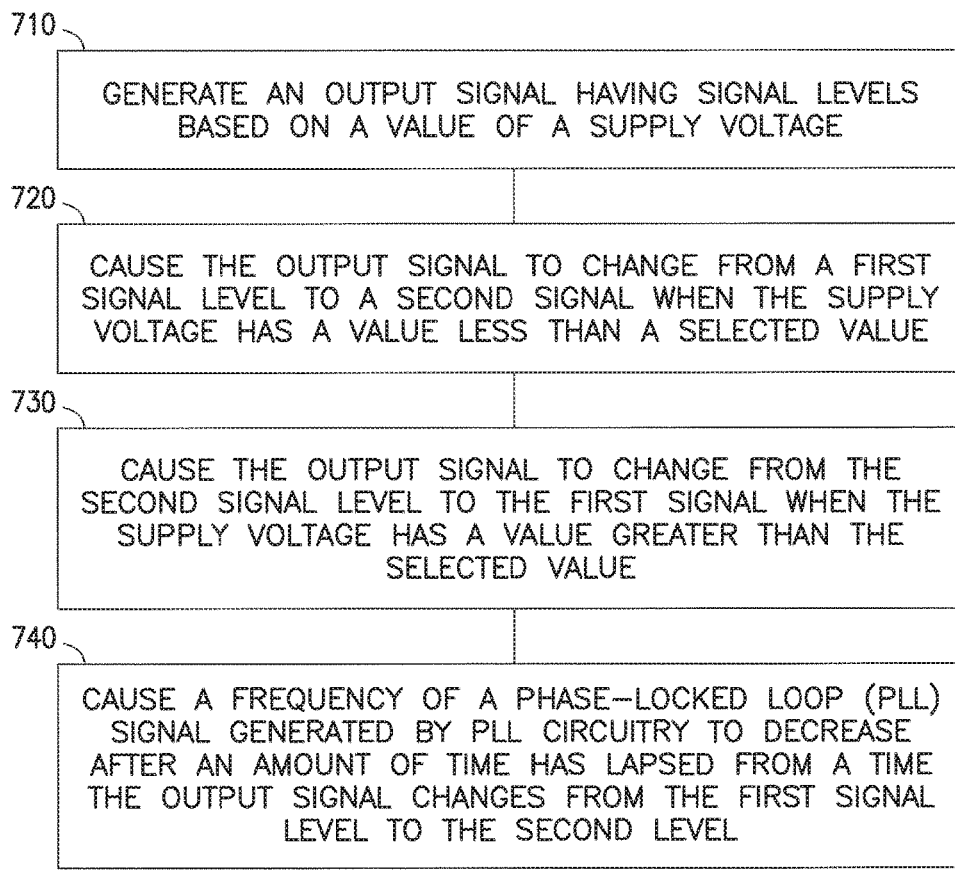
FIG. 7 is a flowchart showing a method of operating an apparatus, according to some embodiments described herein.

FIG. 7 is a flowchart showing a method 700 of operating an apparatus, according to some embodiments described herein. The apparatus used in method 700 can include any of the apparatuses (e.g., apparatuses 100 and 500 and system 600 including droop detectors 101, 201, 301, 401, and 501, and functional unit 503) described above with reference to FIG. 1 through FIG. 6. Some of the activities in method 700 may be performed by hardware, software, firmware, or any combination of hardware, software, and firmware. For example, some of the activities in method 700 may be performed by hardware, software, firmware, or any combination of hardware, software, and firmware implemented in any of the apparatus (e.g., apparatuses 100 and 500 and system 600 including droop detectors 101, 201, 301, 401, and 501, and functional unit 503) described above with reference to FIG. 1 through FIG. 6.

As shown in FIG. 7, activity 710 can include generating an output signal having signal levels based on a value of a supply voltage. Activity 720 can include causing the output signal to change from a first signal level to a second signal when the supply voltage has a value less than a selected value. Activity 730 can include causing the output signal to change from the second signal level to the first signal when the supply voltage has a value greater than the selected value. Activity 740 can include causing a frequency of a signal generated by PLL circuitry to decrease after an amount of time has lapsed from a time the output signal changes from the first signal level to the second level.

Method 700 can include fewer or more activities relative to activities 710, 720, 730, and 740 shown in FIG. 7. For example, method 700 can include activities and operations of apparatuses 100 and 500 and system 600 including droop detectors 101, 201, 301, 401, and 501, and functional unit 503 described above with reference to FIG. 1 through FIG. 6.

The illustrations of the apparatuses (e.g., apparatuses 100 and 500 and system 600 including droop detectors 101, 201, 301, 401, and 501, and functional unit 503) and methods (e.g., method 700 and operations of apparatuses 100 and 500 and system 600 including operations of droop detectors 101, 201, 301, 401, and 501, and functional unit 503) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor modules or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, radios, video players, audio players (e.g., MP3 (Motion Picture Experts Group, Audio Layer 4) players), vehicles, medical devices (e.g., heart monitors, blood pressure monitors, etc.), set top boxes, and others.

Additional Notes and Examples

Example 1 includes subject matter (such as a device, an electronic apparatus (e.g., circuit, electronic system, or both), or a machine) including an input node to receive an input voltage, a circuit portion to generate first, second, and third voltages based on the input voltage, a comparator circuit to compare the first voltage with the second voltage to generate a first signal, and to compare the first voltage with the third voltage to generate a second signal, and an output circuit to generate an output signal based on the first and second signals.

In Example 2, the subject matter of Example 1 may optionally include, wherein the input node includes a supply node.

In Example 3, the subject matter of Example 1 or 2 may optionally include, wherein the supply node is a first supply node, and the comparator circuit includes a second node supply node different from the first supply node.

In Example 4, the subject matter of any of Examples 1-3 may optionally include, wherein the circuit portion is to generate the first, second, and third voltages, such that values of the first, second, and third voltages decrease when a value of the input voltage decreases.

In Example 5, the subject matter of any of Examples 1-3 may optionally include, wherein the circuit portion is to generate the first, second, and third voltages, such that values of the first, second, and third voltages increase when a value of the input voltage increases.

In Example 6, the subject matter of any of Examples 1-3 may optionally include, wherein the circuit portion is to generate the first, second, and third voltages, such that the first voltage has a value greater than a value of each of the second and third voltages.

In Example 7, the subject matter of any of Examples 1-3 may optionally include, wherein the circuit portion includes resistors coupled in series between the input node and a ground node, and the circuit portion is to generate the first voltage based on a voltage at a first node coupled to one of the resistors, generate the second voltage based on a voltage at a second node coupled to one of the resistors, and generate the third voltage based on a voltage at a third node coupled to one of the resistors.

In Example 8, the subject matter of Example 7 may optionally include, wherein the resistors include a first resistor coupled between the input node and the first node, a second resistor coupled between the first node and the second node, and a third resistor coupled between the second node and the third node.

In Example 9, the subject matter of Example 7 may optionally include, wherein the circuit portion includes a first low pass filter coupled to the second node to provide the second voltage based on the voltage at the second node, and a second low pass filter coupled to the third node to provide the third voltage based on the voltage at the third node.

In Example 10, the subject matter of any of Examples 1-3 may optionally include, wherein the output circuit is to generate a third signal, and the output circuit is to generate the output signal, such that the output signal has a first signal level when a first duration between two closest edges of the first and second signals is less than a duration between two closest edges of the first and third signals, and the output signal has a second signal level when a second duration between two closest edges of the first and second signals is In Example 11, the subject matter of Example 1 may optionally include, wherein the output circuit includes a first phase detector to receive the first signal and the second signal to generate a first phase detector signal, a second phase detector to receive a delayed version of the first signal and the second signal to generate a second phase detector signal, and circuitry to cause a signal level of the output signal to change based on signal levels of the first and second phase detector signals.

Example 12 includes subject matter (such as a device, an electronic apparatus (e.g., circuit, electronic system, or both), or a machine) including an input node to receive an input voltage, a capacitor including a first terminal coupled to the input node, a circuit portion including resistors coupled between a supply node and a ground node, and a voltage comparator including a first input node coupled to a second terminal of the capacitor, a second input node coupled to a node between a first resistor and a second resistor among the resistors, and an output node to provide an output signal.

In Example 13, the subject matter of Example 12 may optionally include, wherein the circuit portion includes a unity gain buffer coupled between the second terminal of the capacitor and a node between two of the resistors.

In Example 14, the subject matter of Example 12 may optionally include, wherein the resistors include a third resistor coupled between the supply node and the first input node of the voltage comparator, and a fourth resistor coupled between the first input node of the voltage comparator and the ground node.

In Example 15, the subject matter of Example 12 may optionally include, wherein the supply node is a first supply node, and the input node includes a second supply node different from the first supply node.

Example 16 includes subject matter (such as a device, an electronic apparatus (e.g., circuit, electronic system, or both), or a machine) including a node to receive a supply voltage, a detector to generate an output signal having signal levels based on a value of the supply voltage, the detector to cause the output signal to change from a first signal level to a second signal when the supply voltage has a value less than a selected value, and cause the output signal to change from the second signal level to the first signal when the supply voltage has a value greater than the selected value, and phase-locked loop (PLL) circuitry to generate a PLL signal, the PLL to cause the frequency of the PLL signal to decrease after an amount of time has lapsed from a time the output signal changes from the first signal level to the second level.

In Example 17, the subject matter of Example 16 may optionally include, wherein the PLL circuitry is to cause the frequency of the PLL signal to decrease at a selected time, and the PLL is to cause the frequency of the PLL signal to increase after an amount of time has lapsed from the selected time.

In Example 18, the subject matter of Example 17 may optionally include, further comprising a memory unit to store information having a value corresponding to the amount of time has lapsed from the time the output signal changes from the first signal level to the second level.

In Example 19, the subject matter of Example 18 may optionally include, further comprising a memory unit to store additional information having a value corresponding to the amount of time has lapsed from the selected time.

In Example 20, the subject matter of Example 19 may optionally include, wherein a value of the information is greater than a value of the additional information.

Example 21 includes subject matter (such as a device, an electronic apparatus (e.g., circuit, electronic system, or both), or a machine) including conductive lines on a circuit board, an antenna coupled to the conductive lines, a device coupled to the conductive lines, the device including a detector, the detector including an input node to receive an input voltage, a circuit portion to generate first, second, and third voltages based on the input voltage, a comparator circuit to compare the first voltage with the second voltage to generate a first signal, and to compare the first voltage with the third voltage to generate a second signal, and an output circuit to generate an output signal based on the first and second signals.

In Example 22, the subject matter of Example 21 may optionally include, wherein the output circuit is to cause a signal level of the output to change when a value of the input signal is less than a value of the third voltage, and the device includes a phase-locked loop (PLL) to generate a PLL signal, the PLL to cause the frequency of the PLL signal to decrease after an amount of time has lapsed from a time the level signal of the output signal changes.

In Example 23, the subject matter of Example 21 or 22 may optionally include, wherein the conductive lines conform to at least one of Universal Serial Bus (USB), DisplayPort (DP), High-Definition Multimedia Interface (HDMI), Thunderbolt, Ethernet, and Peripheral Component Interconnect Express (PCIe) specifications.

Example 24 includes subject matter (such as a method of operating a device, an electronic apparatus (e.g., circuit, electronic system, or both), or a machine) including generating an output signal having signal levels based on a value of a supply voltage, causing the output signal to change from a first signal level to a second signal when the supply voltage has a value less than a selected value, causing the output signal to change from the second signal level to the first signal when the supply voltage has a value greater than the selected value, and causing a frequency of a phase-locked loop (PLL) signal generated by PLL circuitry to decrease after an amount of time has lapsed from a time the output signal changes from the first signal level to the second level.

In Example 25, the subject matter of Example 24 may optionally include, wherein generating the output signal includes generating first, second, and third voltages based on the supply voltage, comparing the first voltage with each of the second and third voltages to generate comparison results, and generating an output signal based on the comparison results.

In Example 26, the subject matter of Example 24 may optionally include, wherein generating the output signal includes providing the supply voltage to a first terminal of a capacitor, providing a first voltage at a second terminal of the capacitor to a first node, providing a second voltage to a second node, and comparing the first voltage with the second voltage to generate the output signal.

In Example 27, the subject matter of Example 26 may optionally include, further comprising causing the frequency of the PLL, signal to increase after the frequency of the PLL signal is decreased.

In Example 28, the subject matter of Example 27 may optionally include, further comprising storing information having a value corresponding to the amount of time lapsed from the time the output signal changes from the first signal level to the second level.

In Example 29, the subject matter of Example 28 may optionally include, further comprising storing additional information having a value corresponding to the amount of time lapsed from a time the frequency of the PLL signal is decreased to a time the frequency of the PLL signal is increased.

Example 30 includes subject matter (such as a device, an electronic apparatus (e.g., circuit, electronic system, or both), or machine) including means for performing any of the subject matter of Example 24 through Example 29.

The subject matter of Example 1 through Example 30 may be combined in any combination.

The above description and the drawings illustrate some embodiments to enable those skilled in the art to practice the embodiments of the invention. Other embodiments may incorporate structural, logical, electrical, process, and other changes. Examples merely typify possible variations. Portions and features of some embodiments may be included in, or substituted for, those of other embodiments. Many other embodiments will be apparent to those of skill in the art upon reading and understanding the above description. Therefore, the scope of various embodiments is determined by the appended claims, along with the full range of equivalents to which such claims are entitled.

In the detailed description and the claims, a list of items joined by the term "at least one of" can mean any combination of the listed items. For example, if items A and B are listed, then the phrase "at least one of A and B" can mean A only; B only; or A and B. In another example, if items A, B, and C are listed, then the phrase "at least one of A, B and C" can mean A only; B only; C only; A and B (excluding C); A and C (excluding B); B and C (excluding A); or all of A, B, and C. Item A can include a single element or multiple elements. Item B can include a single element or multiple elements, item C can include a single element or a multiple elements.

In the detailed description and the claims, a list of items joined by the term "one of" can mean only one of the listed items. For example, if items A and B are listed, then the phrase "one of A and B" can mean A only (excluding B), or B only (excluding A). In another example, if items A, B, and C are listed, then the phrase "one of A, B and C" can mean A only; B only; or C only. Item A can include a single element or multiple elements. Item B can include a single element or multiple elements. Item C can include a single element or a multiple elements.

The Abstract is provided to comply with 47 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. An apparatus comprising:
    an input node to receive an input voltage;
    a circuit portion to generate first, second, and third voltages based on the input voltage;
    a comparator circuit to compare the first voltage with the second voltage to generate a first signal, and to compare the first voltage with the third voltage to generate a second signal; and
    an output circuit to generate an output signal based on the first and second signals.

2. The apparatus of claim 1, wherein the input node includes a supply node.

3. The apparatus of claim 2, wherein the supply node is a first supply node, and the comparator circuit includes a second node supply node different from the first supply node.

4. The apparatus of claim 1, wherein the circuit portion is to generate the first, second, and third voltages, such that values of the first, second, and third voltages decrease when a value of the input voltage decreases.

5. The apparatus of claim 1, wherein the circuit portion is to generate the first, second, and third voltages, such that values of the first, second, and third voltages increase when a value of the input voltage increases.

6. The apparatus of claim 1, wherein the circuit portion is to generate the first, second, and third voltages, such that the first voltage has a value greater than a value of each of the second and third voltages.

7. The apparatus of claim 1, wherein the circuit portion includes resistors coupled in series between the input node and a ground node, and the circuit portion is to:
    generate the first voltage based on a voltage at a first node coupled to one of the resistors;
    generate the second voltage based on a voltage at a second node coupled to one of the resistors; and
    generate the third voltage based on a voltage at a third node coupled to one of the resistors.

8. The apparatus of claim 7, wherein the resistors include:
    a first resistor coupled between the input node and the first node;
    a second resistor coupled between the first node and the second node; and
    a third resistor coupled between the second node and the third node.

9. The apparatus of claim 7, wherein the circuit portion includes:
    a first low pass filter coupled to the second node to provide the second voltage based on the voltage at the second node; and
    a second low pass filter coupled to the third node to provide the third voltage based on the voltage at the third node.

10. The apparatus of claim 1, wherein the output circuit is to generate a third signal, and the output circuit is to generate the output signal, such that:
    the output signal has a first signal level when a first duration between two closest edges of the first and second signals is less than a duration between two closest edges of the first and third signals; and the output signal has a second signal level when a second duration between two closest edges of the first and second signals is greater than a second duration between two closest edges of the first and third signals.

11. The apparatus of claim 1, wherein the output circuit includes:
a first phase detector to receive the first signal and the second signal to generate a first phase detector signal;
a second phase detector to receive a delayed version of the first signal and the second signal to generate a second phase detector signal; and
circuitry to cause a signal level of the output signal to change based on signal levels of the first and second phase detector signals.

12. An apparatus comprising:
an input node to receive an input voltage;
a capacitor including a first terminal coupled to the input node;
a circuit portion including resistors coupled between a supply node and a ground node; and
a voltage comparator including a first input node coupled to a second terminal of the capacitor, a second input node coupled to a node between a first resistor and a second resistor among the resistors, and an output node to provide an output signal.

13. The apparatus of claim 12, wherein the circuit portion includes a unity gain buffer coupled between the second terminal of the capacitor and a node between two of the resistors.

14. The apparatus of claim 12, wherein the resistors include a third resistor coupled between the supply node and the first input node of the voltage comparator, and a fourth resistor coupled between the first input node of the voltage comparator and the ground node.

15. The apparatus of claim 12, wherein the supply node is a first supply node, and the input node includes a second supply node different from the first supply node.

16. An apparatus comprising:
conductive lines on a circuit board;
an antenna coupled to the conductive lines;
a device coupled to the conductive lines, the device including a detector, the detector including:
an input node to receive an input voltage;
a circuit portion to generate first, second, and third voltages based on the input voltage;
a comparator circuit to compare the first voltage with the second voltage to generate a first signal, and to compare the first voltage with the third voltage to generate a second signal; and
an output circuit to generate an output signal based on the first and second signals.

17. The apparatus of claim 16, wherein the output circuit is to cause a signal level of the output to change when a value of the input signal is less than a value of the third voltage, and the device includes a phase-locked loop (PLL) to generate a PLL signal, the PLL to cause the frequency of the PLL signal to decrease after an amount of time has lapsed from a time the level signal of the output signal changes.

18. The apparatus of claim 16, wherein the conductive lines conform to at least one of Universal Serial Bus (USB), DisplayPort (DP), High-Definition Multimedia Interface (HDMI), Thunderbolt, Ethernet, and Peripheral Component Interconnect Express (PCIe) specifications.

* * * * *